(12) United States Patent
Wang et al.

(10) Patent No.: US 12,396,296 B2
(45) Date of Patent: Aug. 19, 2025

(54) LIGHT-EMITTING DEVICE

(71) Applicant: Quanzhou Sanan Semiconductor Technology Co., Ltd., Fujian (CN)

(72) Inventors: Huining Wang, Fujian (CN); Hongwei Xia, Fujian (CN); Quanyang Ma, Fujian (CN); Shiwei Liu, Fujian (CN); Jiali Zhuo, Fujian (CN); Shuo Yang, Fujian (CN); Su-Hui Lin, Fujian (CN); Chung-Ying Chang, Fujian (CN)

(73) Assignee: Quanzhou Sanan Semiconductor Technology Co., Ltd, Fujian (CN)

( * ) Notice: Subject to any disclaimer, the term of this patent is extended or adjusted under 35 U.S.C. 154(b) by 459 days.

(21) Appl. No.: 17/992,717

(22) Filed: Nov. 22, 2022

(65) Prior Publication Data
US 2023/0231075 A1    Jul. 20, 2023

(30) Foreign Application Priority Data
Jan. 20, 2022 (CN) .......................... 202210063980.4

(51) Int. Cl.
*H01L 29/66* (2006.01)
*H10H 20/00* (2025.01)
(Continued)

(52) U.S. Cl.
CPC ....... *H10H 20/816* (2025.01); *H10H 20/8252* (2025.01)

(58) Field of Classification Search
CPC ............. H10H 20/816; H10H 20/8252; H10H 20/8162; H10H 20/841; H01L 23/60
(Continued)

(56) References Cited

U.S. PATENT DOCUMENTS

2015/0053920 A1* 2/2015 Yeh .................... H10H 20/0137
                                                     438/37
2015/0263228 A1* 9/2015 Lee ...................... H10H 20/811
                                                     257/76
(Continued)

OTHER PUBLICATIONS

Search Report appended to an Office Action, which was issued to Chinese counterpart application No. 202210063980.4 by the CNIPA on Mar. 4, 2022 with an English translation thereof.
(Continued)

*Primary Examiner* — Sheikh Maruf
(74) *Attorney, Agent, or Firm* — MUNCY, GEISSLER, OLDS & LOWE, P.C.

(57) ABSTRACT

A light-emitting device includes an epitaxial structure that includes a first semiconductor layer, an active layer and a second semiconductor layer. The light-emitting device further has a transparent current spreading unit, a first electrode and a second electrode. The transparent current spreading unit includes a first transparent current spreading layer and a second transparent current spreading layer. The first transparent current spreading layer is doped with aluminum and has a thickness that accounts for 0.5% to 33% of a thickness of the transparent current spreading unit. The second transparent current spreading layer has a thickness greater than that of the first transparent current spreading layer. A light-emitting apparatus includes a circuit control component, and a light source that is coupled to the circuit control component and that includes the aforesaid light-emitting device.

20 Claims, 3 Drawing Sheets

(51) Int. Cl.
    *H10H 20/816* (2025.01)
    *H10H 20/825* (2025.01)
(58) Field of Classification Search
    USPC .......................................................... 257/98
    See application file for complete search history.

(56) References Cited

U.S. PATENT DOCUMENTS

| | | | |
|---|---|---|---|
| 2016/0056334 A1* | 2/2016 | Jang | H10H 20/01335 438/45 |
| 2017/0133552 A1* | 5/2017 | Lai | H10H 20/816 |
| 2017/0236974 A1* | 8/2017 | Malinverni | H10H 20/816 372/46.01 |
| 2018/0062038 A1* | 3/2018 | Fujiwara | H10H 20/8215 |
| 2018/0138361 A1* | 5/2018 | Shu | H10H 20/0137 |
| 2018/0351039 A1* | 12/2018 | Kim | H10H 20/8252 |
| 2019/0081208 A1* | 3/2019 | Choi | H10H 20/83 |
| 2019/0115497 A1* | 4/2019 | Zhang | H10H 20/812 |
| 2020/0235260 A1* | 7/2020 | Watanabe | H10H 20/825 |
| 2020/0287087 A1* | 9/2020 | Watanabe | H10H 20/816 |
| 2021/0005780 A1* | 1/2021 | Tsai | H10H 20/825 |

OTHER PUBLICATIONS

Wu Chia-cheng, et al, "Growth of Al-doped ZnO window layer for GaN LED application", Chinese Journal of Luminescence, vol. 29, No. 3 , Jun. 2008, pp. 508-512.

* cited by examiner

LIGHT-EMITTING DEVICE

CROSS-REFERENCE TO RELATED APPLICATION

This application claims priority to Chinese Invention Patent Application No. 202210063980.4, filed on Jan. 20, 2022, which is incorporated herein by reference in its entirety.

FIELD

The disclosure relates to a semiconductor device, and more particularly to a light-emitting device.

BACKGROUND

Light emitting diodes (LEDs) are usually made of semiconductor materials such as gallium nitride (GaN), gallium arsenide (GaAs), gallium phosphide (GaP), gallium arsenide phosphide (GaAsP), etc. An LED includes a P-N junction having a light emitting property. When applying a forward bias to the LED, electrons flow from an N region to a P region of the LED while holes flow from the P region to the N region, then the electrons and the holes in each of the N and P regions recombine to emit light. The LEDs are considered to be one of the light sources having the most potential as they offer advantages such as high luminous intensity, high efficiency, small size and long lifespan. However, despite having the abovementioned advantages, the LEDs may easily be damaged by electrostatic discharge (ESD). Therefore, preventing the LEDs from harms of electrostatic discharge becomes an issue to be resolved.

SUMMARY

Therefore, an object of the disclosure is to provide a light-emitting device that can alleviate at least one of the drawbacks of the prior art.

According to the first aspect of the disclosure, a light-emitting device includes an epitaxial structure that includes a first semiconductor layer, an active layer disposed on the first semiconductor layer, and a second semiconductor layer disposed on the active layer opposite to the first semiconductor layer, a transparent current spreading unit that is disposed on the second semiconductor layer, a first electrode that is disposed on the epitaxial structure and electrically connected to the first semiconductor layer, and a second electrode that is disposed on the transparent current spreading unit. The transparent current spreading unit includes a first transparent current spreading layer and a second transparent current spreading layer. The first transparent current spreading layer is disposed between and connected to the second electrode and the second transparent current spreading layer. The second transparent current spreading layer is connected to the second semiconductor layer. The first transparent current spreading layer is doped with aluminum and has a thickness that accounts for 0.5% to 33% of a thickness of the transparent current spreading unit. The second transparent current spreading layer has a thickness greater than that of the first transparent current spreading layer.

According to the second aspect of the disclosure, a light-emitting apparatus has a circuit control component, and a light source that is coupled to the circuit control component and that includes the aforesaid light-emitting device.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
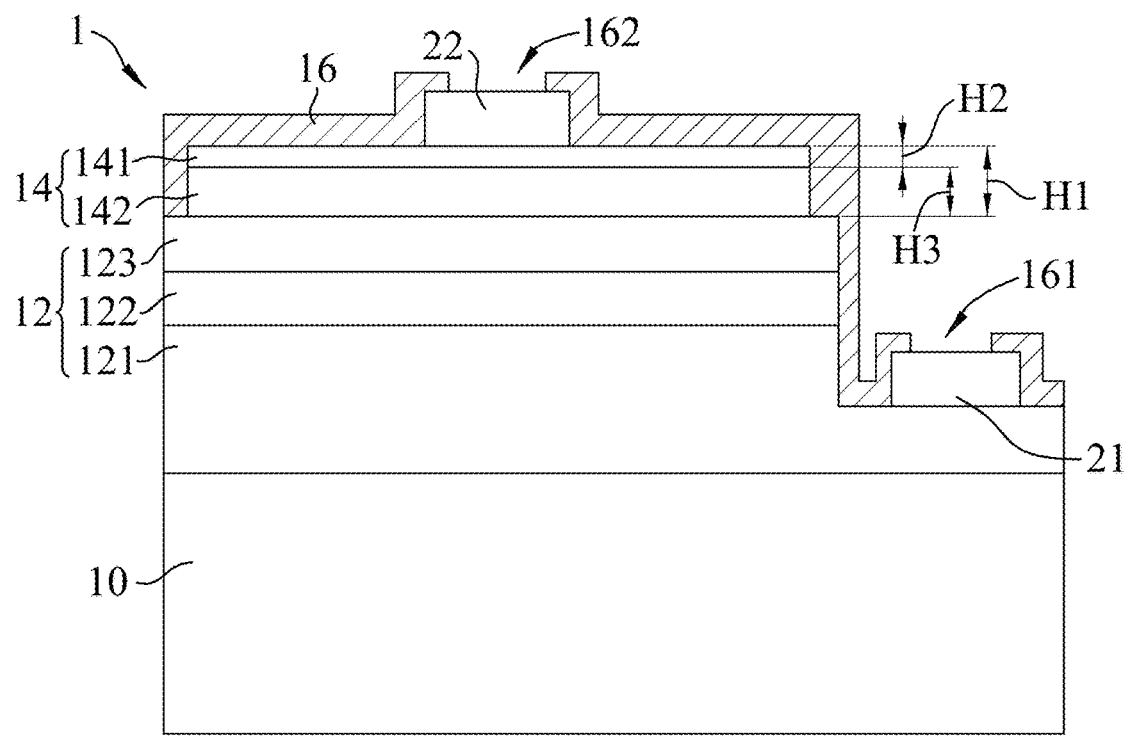
FIG. 1 is a schematic view illustrating a first embodiment of a light-emitting device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
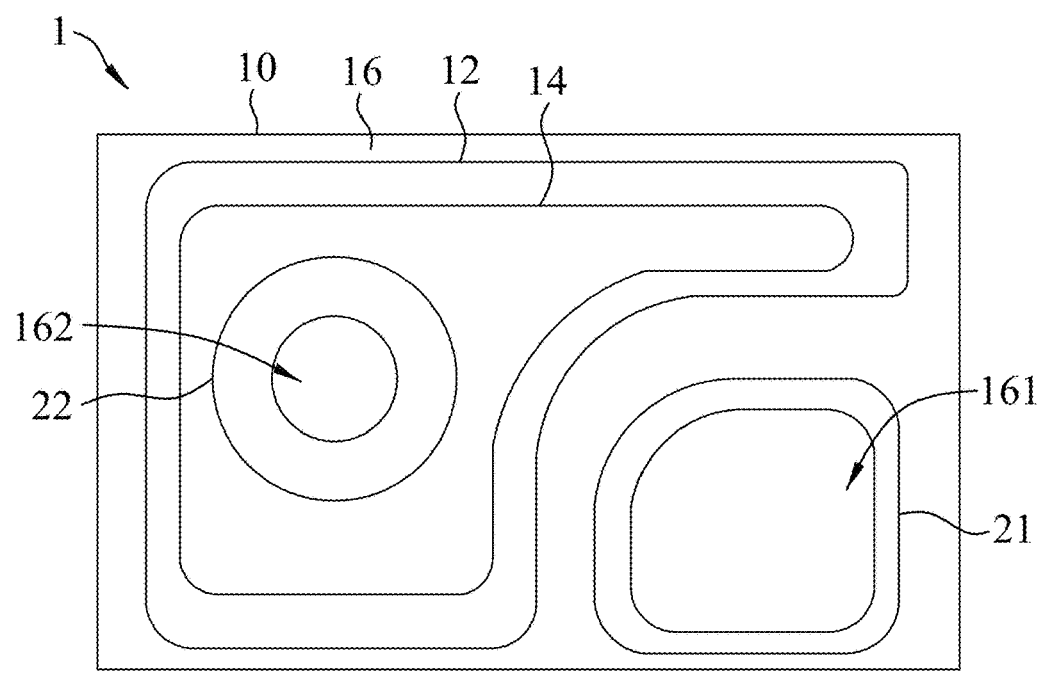
FIG. 2 is a schematic top view of the first embodiment of the light-emitting device according to the disclosure.

Referring to FIGS. 1 and 2, a first embodiment of a light-emitting device 1 according to the disclosure includes a substrate 10, an epitaxial structure 12, a transparent current spreading unit 14, an insulation layer 16, a first electrode 21 and a second electrode 22.

The substrate 10 may be a light-transmissible substrate, an opaque substrate or a semi-transparent substrate. In a case of the substrate 10 being a light-transmissible or semi-transparent substrate, light emitted from the epitaxial structure 12 may pass through the substrate 10 to reach a side of the substrate 10 opposite to the epitaxial structure 12. The substrate 10 may be, but is not limited to, a flat sapphire substrate, a patterned sapphire substrate, a silicon substrate, a silicon carbide substrate, a gallium nitride substrate or a glass substrate.

In certain embodiments, the substrate 10 is a patterned substrate including a base and a plurality of protrusions disposed on the base. Each of the protrusions may be a monolayer structure or a multi-layered structure and contains at least one light extraction layer. The light extraction layer may have a refractive index lower than that of the base, and has a thickness that is greater than half of a height of the protrusion, which may enhance the light exiting efficiency of the light-emitting device 1. In certain embodiments, each of the protrusions may be in a dome shape, and the refractive index of the light extraction layer is smaller than 1.6. For example, the light extraction layer may be made of silicon dioxide ($SiO_2$). In certain embodiments, the substrate 10 is thinned or removed so as to form a thin film-type LED chip.

The epitaxial structure 12 is disposed on the substrate 10 and includes a first semiconductor layer 121, an active layer 122 and a second semiconductor layer 123 that are sequentially disposed on the substrate 10 in such order in a bottom-top direction.

The first semiconductor layer 121 is formed on the substrate 10 and may be doped with an n-type dopant. For example, the first semiconductor layer 121 may be, but is not limited to, a gallium nitride (GaN)-based semiconductor layer doped with silicon (Si). In certain embodiments, the epitaxial structure 12 further includes a buffer layer (not shown) that is disposed between the first semiconductor layer 121 and the substrate 10. In certain embodiments, the first semiconductor layer 121 may be connected to the substrate 10 through a bonding layer (not shown).

The active layer 122 is disposed on the first semiconductor layer 121 opposite to the substrate 10 and may have a quantum well (QW) structure. In certain embodiments, the active layer 122 may have a multiple quantum well (MQW) structure that includes multiple well layers and multiple barrier layers alternately and repetitively stacked. Additionally, the wavelength of the light emitted by the active layer 122 may be determined by the composition and the thickness of the well layers. That is to say, by adjusting the composition of the well layers, the active layer 122 may emit different colors of light, such as ultraviolet light, blue light, green light or yellow light.

The second semiconductor layer 123 is disposed on the active layer 122 opposite to the first semiconductor layer 121 and may be a semiconductor layer doped with a p-type dopant. For example, the second semiconductor layer 123 may be, but is not limited to, a GaN-based semiconductor layer doped with magnesium (Mg). Each of the first semiconductor layer 121 and the second semiconductor layer 123 may have a monolayer structure or a multi-layered structure, and may include a superlattice layer. In certain embodiments, the first semiconductor layer 121 may be doped with a p-type dopant and the second semiconductor layer 123 may be doped with an n-type dopant, i.e., the first semiconductor layer 121 is a p-type semiconductor layer and the second semiconductor layer 123 is an n-type semiconductor layer.

The transparent current spreading unit 14 is disposed on the second semiconductor layer 123 to spread current more uniformly, reduce the operating voltage of the light-emitting device 1, and enhance the light existing performance of the light-emitting device 1. The transparent current spreading unit 14 may include a transparent and electrically conductive material (e.g., a transparent and electrically conductive oxide). The transparent and electrically conductive material may be, but is not limited to, indium tin oxide (ITO), indium zinc oxide (IZO), indium oxide (InO), tin oxide (SnO), cadmium tin oxide (CTO), antimony tin oxide (ATO), aluminum zinc oxide (AZO), zinc tin oxide (ZTO), gallium-doped zinc oxide (GZO), tungsten-doped indium oxide (IWO), zinc oxide (ZnO) or combinations thereof.

The transparent current spreading unit 14 includes a first transparent current spreading layer 141 and a second transparent current spreading layer 142. The first transparent current spreading layer 141 is disposed between and connected to the second electrode 22 and the second transparent current spreading layer 142; the second transparent current spreading layer 142 is connected to the second semiconductor layer 123 and is disposed between the second semiconductor layer 123 and the first transparent current spreading layer 141. The first transparent current spreading layer 141 is doped with aluminum. In other words, a top portion of the transparent current spreading unit 14 adjacent to the second electrode 22 is doped with aluminum. In some embodiments, the second transparent current spreading layer 142 covers and is in direct contact with the second semiconductor layer 123 to reduce the overall size of the light-emitting device 1.

Specifically, aluminum may be diffused into the first transparent current spreading layer 141 through a coating process in combination with an annealing process. Aluminum may exist in the first transparent current spreading layer 141 in the form of interstitial atom or substitutional atom, and free electrons in the outermost layer of aluminum may participate in conduction so as to increase concentration of charge carrier and reduce lateral resistance of the first transparent current spreading layer 141 and operating voltage, thereby improving protection against ESD for the light-emitting device 1. In addition, doping with aluminum may increase resistance of the light-emitting device 1 against aging, achieving no rising voltage, no light attenuation, and no leakage under long-term high junction temperature when the light-emitting device 1 is turned on.

Figure 3:
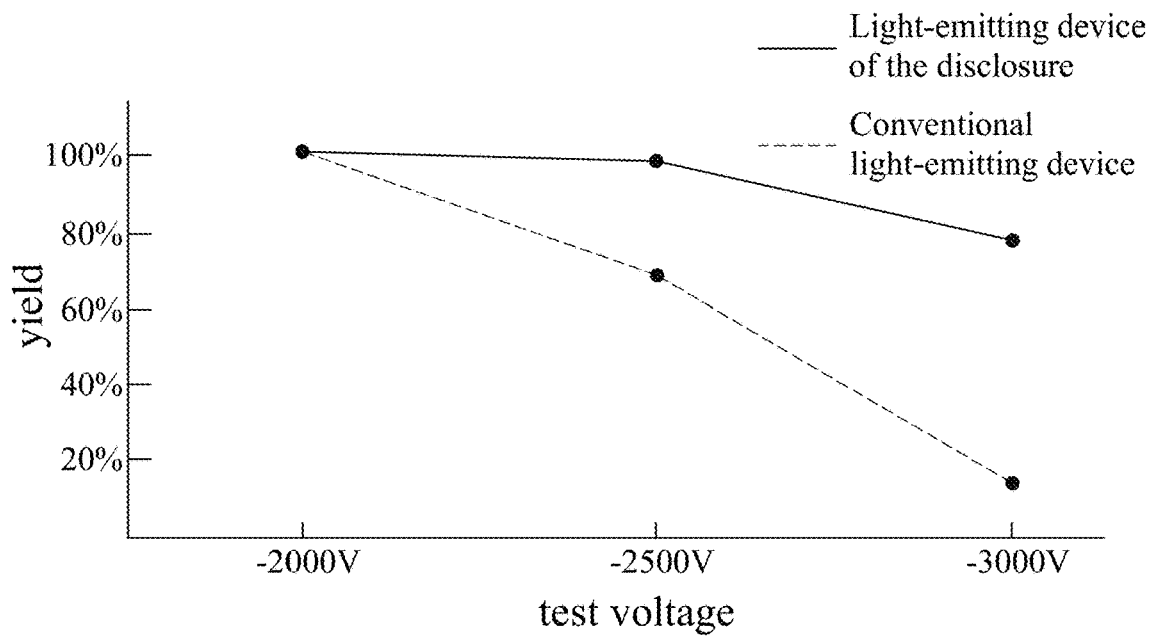
FIG. 3 is a graph illustrating yield percentage of a conventional light-emitting device and the light-emitting device of the disclosure after being subjected to an anti-electrostatic test.

FIG. 3 shows yield percentage of a conventional light-emitting device and the light-emitting device 1 of the disclosure after being subjected to an anti-electrostatic test. In FIG. 3, the dashed line represents the conventional light-emitting device having a conventional transparent current spreading layer; the solid line represents the light-emitting device 1 having the aluminum-doped transparent current spreading unit 14. The above two light-emitting devices are put to an anti-electrostatic test to test their anti-electrostatic properties. Details of the test are as follows. First, Sample A (i.e., the conventional light-emitting device) and Sample B (i.e., the light-emitting device 1 of the present disclosure) are provided, both are exactly the same in structure except for their transparent current spreading layers. In Sample A, an indium tin oxide (ITO) layer having a thickness of 150 nm is adopted as its transparent current spreading layer. The transparent current spreading unit 14 of Sample B, on the other hand, includes an indium tin oxide (ITO) layer having a thickness of 130 nm (i.e., functions as the second transparent current spreading layer 142) and another indium tin oxide (ITO) layer having a thickness of 20 nm and doped with aluminum (i.e., functions as the first transparent current spreading layer 141). 100 Samples A and 100 Samples B undergo the anti-electrostatic test. The test is performed sequentially on each of the samples and conducted under each of the following voltages: −2000 V, −2500 V, and −3000 V. The number of the samples retaining effective lighting performance is then determined, i.e., samples that pass the anti-electrostatic test. Out of the 100 Samples A (i.e., the conventional light-emitting devices), 99 Samples A retain effective lighting performance after being put under −2000 V, 68 Samples A retain effective lighting performance after being put under −2000 V and −2500 V, and 14 Samples A retain effective lighting performance after being put under −2000 V, —2500 V and −3000 V. Out of the 100 Samples B (i.e., the light-emitting devices 1 of the present disclosure), 100 Samples B retain effective lighting performance after being put under −2000 V, 98 Samples B retain effective lighting performance after being put under −2000 V and −2500 V, and 78 Samples B retain effective lighting performance after being put under −2000 V, −2500 V and −3000 V. In FIG. 3, yield is obtained by the following formula: (the number of the samples that pass the anti-electrostatic test/100 samples)×100%. It is shown from FIG. 3 that, after adopting the aluminum-doped transparent current spreading unit 14, the level of protection against ESD of the light-emitting device 1 of the present disclosure may effectively be increased.

Referring to FIG. 1, the insulation layer 16 covers the epitaxial structure 12, the transparent current spreading unit 14, the first electrode 21 and the second electrode 22, providing an insulating effect. The insulation layer 16 has a first opening 161 and a second opening 162. The first opening 161 is located on top of the first electrode 21 so as to expose the first electrode 21. The second opening 162 is located on top of the second electrode 22 so as to expose the second electrode 22.

Depending on the location where the insulation layer 16 is disposed, the insulation layer 16 may provide different functions. For example, the insulation layer 16 that covers a side wall of the epitaxial structure 12 may prevent, but is not limited to, conductive materials from leaking to electrically connect the first semiconductor layer 121 and the second semiconductor layer 123, thereby reducing possibilities of short circuit of the light-emitting device 1. The insulation layer 16 may be made of a non-conductive material. In some embodiments, the non-conductive material may be an inorganic material or a dielectric material. The inorganic material may include silicone. The dielectric material may include aluminum oxide (AlO), silicon nitride (SiNx), silicon oxide (SiOx), titanium oxide (TiOx), or magnesium fluoride (MgFx). The insulation layer 16 may also be made of an electrical insulating material including silicon dioxide, silicon nitride, titanium oxide, tantalum oxide, niobium oxide, barium titanate, or combinations thereof. The insulation layer 16 may be a distributed Bragg reflector (DBR) formed by alternately and repeatedly stacking at least two of the aforesaid materials.

The first electrode 21 is disposed on the epitaxial structure 12 and electrically connected to the first semiconductor layer 121. The first electrode 21 may be directly connected to the first semiconductor layer 121. The second electrode 22 is disposed on the transparent current spreading unit 14. In certain embodiments, the second electrode 22 is in direct contact with the first transparent current spreading layer 141. The first electrode 21 and the second electrode 22 may include, but is not limited to, a metal material such as chromium, titanium, nickle, gold, aluminum, platinum or combinations thereof.

In certain embodiments, referring to FIGS. 1 and 2, the light-emitting device 1 is a small sized LED chip having at least one length that is no greater than 200 μm. The small sized LED chip may improve its protection against ESD by having the first transparent current spreading layer 141 that is doped with aluminum, without the need of having structures such as a current blocking layer or finger electrode, thereby meeting the requirement of small size. It should be noted that, it is not possible to add structures such as a current blocking layer or finger electrode to mini LED chips that are currently available on the market due to its size being too small. As a result, the level of protection against ESD of the mini LED chips is relatively poor. However, the LED chip of this embodiment may meet the level of protection against ESD and small size as required at the same time.

In certain embodiments, referring to FIG. 1, to ensure the transparent conductivity of the transparent current spreading unit 14, the transparent current spreading unit 14 has a thickness (H1) that ranges from 20 nm to 150 nm. The first transparent current spreading layer 141 may have a thickness (H2) ranging from 1 nm to 50 nm, and the second transparent current spreading layer 142 may have a thickness (H3) ranging from 10 nm to 140 nm. In addition, the thickness (H3) of the second transparent current spreading layer 142 is greater than the thickness (H2) of the first transparent current spreading layer 141. In some embodiments, the thickness (H3) of the second transparent current spreading layer 142 is at least double of the thickness (H2) of the first transparent current spreading layer 141; the thickness (H2) of the first transparent current spreading layer 141 accounts for 0.5% to 33% of the overall thickness (H1) of the transparent current spreading unit 14. Although increasing the thickness of the first transparent current spreading layer 141 may improve its ability in lateral current spreading, too much increment in thickness thereof may adversely affect the performance of the light-emitting device 1 in other aspects. For instance, doping a middle portion of the transparent current spreading unit 14 with aluminum may decrease the light extraction efficiency of the light-emitting device 1 due to particles of the metal (i.e, aluminum) being opaque, which absorbs light. For another instance, doping a bottom portion of the transparent current spreading unit 14 with aluminum may cause ohmic contact to deteriorate and voltage of the light-emitting device 1 to rise because the difference in work function between aluminum and p-type gallium nitride is relatively large. In this embodiment, aluminum is doped within the first transparent current spreading layer 141 and the thickness of the first transparent current spreading layer 141 is kept at a certain range so as to increase the level of protection against ESD for the light-emitting device 1, and avoid rising voltage or light absorption.

In some embodiments, the aluminum concentration of the first transparent current spreading layer 141 decreases in a direction from the second electrode 22 to the second semiconductor layer 123. In other words, the aluminum concentration in the first transparent current spreading layer 141 decreases in a direction from a top surface of the first transparent current spreading layer 141 to an interior thereof. For example, when the first transparent current spreading layer 141 is divided into a first area, a second area, a third area and a fourth area in a top-bottom direction, and a thickness of each area accounts for 25% of the overall thickness (H2) of the first transparent current spreading layer 141, an aluminum concentration (i.e., average concentration) in the first area is greater than that in the second area, an aluminum concentration in the second area is greater than that in the third area, and an aluminum concentration in the third area is greater than that in the fourth area. By decreasing the aluminum concentration of the first transparent current spreading layer 141 in the direction from its top surface to its interior, conductivity of the first transparent current spreading layer 141 may effectively be enhanced, lateral spreading of the charge carriers improved, and operating voltage of the light-emitting device 1 lowered. In one embodiment, by coating an aluminum layer on the top surface of the first transparent current spreading layer 141, followed by annealing, aluminum may be diffused so as to achieve the effect of gradual concentration of aluminum from the top surface to the interior of the first transparent current spreading layer 141.

Figure 4:
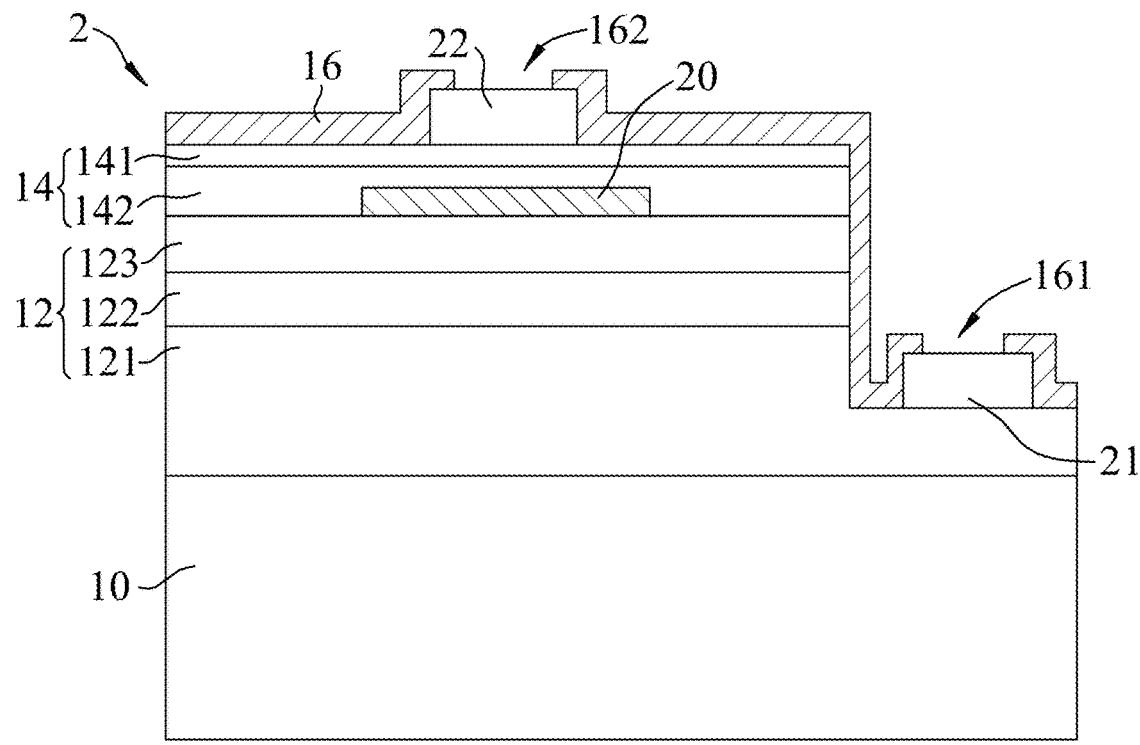
FIG. 4 is a schematic view illustrating a second embodiment of the light-emitting device according to the disclosure.

Referring to FIG. 4, compared to the light-emitting device 1 of FIG. 1, a second embodiment of the light-emitting device 2 according to the disclosure is larger in size, such as having a length greater than 200 μm. The light-emitting device 2 of the second embodiment has a structure similar to that of the first embodiment, except that the light-emitting device 2 of the second embodiment may further include a current blocking layer 20 that is disposed between the second electrode 22 and the second semiconductor layer 123. In this embodiment, the current blocking layer 20 is embedded in the transparent current spreading unit 14, e.g., in the second transparent current spreading layer 142. The current blocking layer 20 serves to block current to prevent current crowding, thereby improving the light exiting efficiency.

Figure 5:
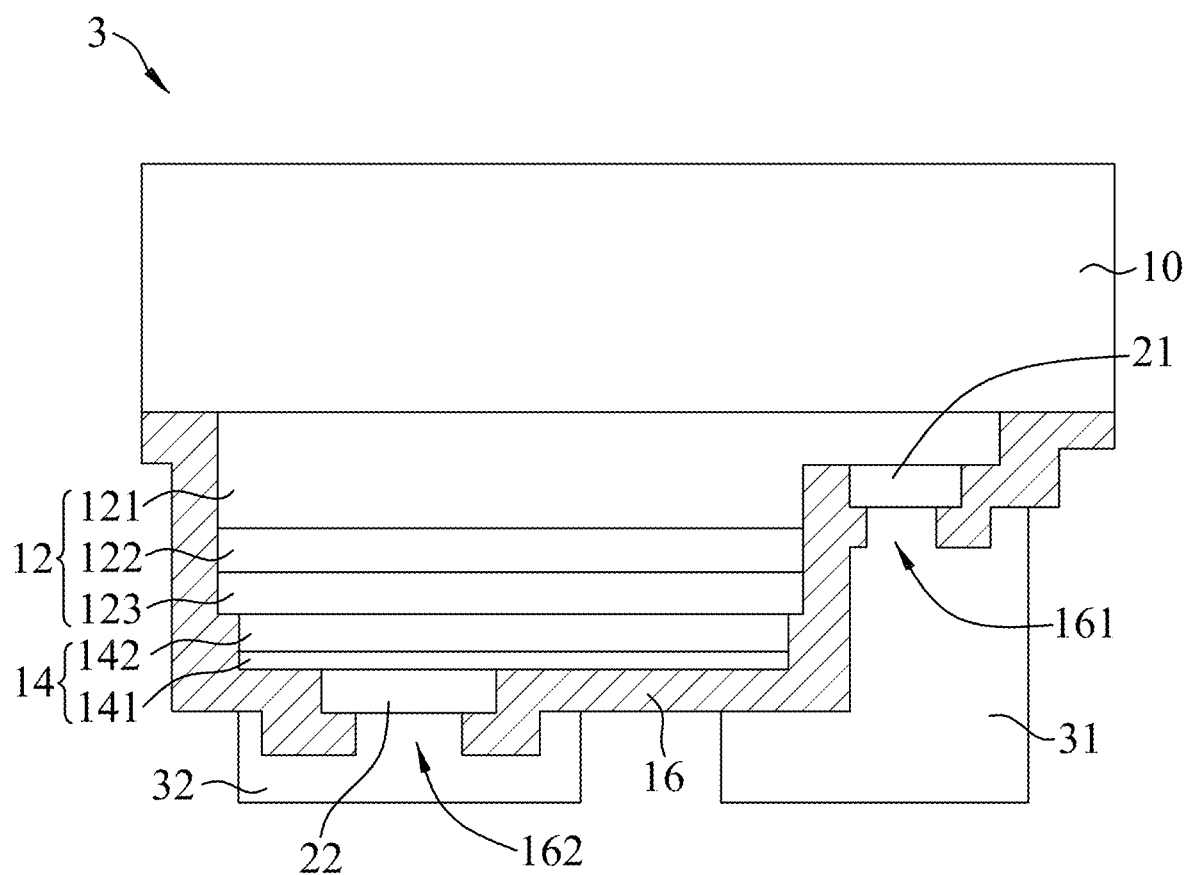
FIG. 5 is a schematic view illustrating a third embodiment of the light-emitting device according to the disclosure.

Referring to FIG. 5, compared to the light-emitting device 1 of FIG. 1 that has a face-up configuration, a third embodiment of the light-emitting device 3 according to the disclosure has a flip-chip configuration. The light-emitting device 3 of the third embodiment further includes a first pad 31 and a second pad 32. The first pad 31 and the second pad 32 are both located on the insulation layer 16 and respectively extend into the first opening 161 and the second opening 162 so as to be respectively and electrically connected to the first electrode 21 and the second electrode 22. The first pad 31 and the second pad 32 may simultaneously be formed using a same material and technique, therefore the first pad 31 and the second pad 32 have the same structure. The insulation layer 16 may further extend to cover a surface of the substrate 10 on which the epitaxial structure 12 is disposed.

It should be noted that components of the transparent current spreading unit 14 and concentrations thereof may be determined using techniques such as Secondary Ion Mass Spectrometry (SIMS) or Energy Dispersive Spectroscopy (EDS).

This disclosure further provides a light-emitting apparatus that includes a circuit control component and a light source that is coupled to the circuit control component. The circuit control component serves to control the light source for light emitting. The light-emitting device may include any one of the aforesaid light-emitting devices 1, 2 and 3.

In certain embodiments, the light-emitting device 1, 2, 3 is a small-sized LED that may be applied to a backlight display or an RGB display screen. Hundreds, thousands or tens of thousands of such small-sized LEDs may be disposed on a substrate or a package substrate so as to form a light source for the backlight display or the RGB display screen.

In summary, by virtue of doping the first transparent current spreading layer 141 with aluminum (i.e., doping the top portion of the transparent current spreading unit 14 that is proximate to the second electrode 22 with aluminum), the concentration of the charge carrier is increased and so does conductivity of the light-emitting device 1, 2, 3, which in turn decreases the operating voltage thereof and increases the level of protection against ESD for the light-emitting device 1, 2, 3. In addition, doping with aluminum may increase resistance of the light-emitting device 1, 2, 3 against aging, achieving no rising voltage, no light attenuation, and no leakage under long-term high junction temperature when the light-emitting device 1, 2, 3 is turned on.

Furthermore, by virtue of decreasing the aluminum concentration in the first transparent current spreading layer 141 in the direction from the top surface to the interior thereof, conductivity of the first transparent current spreading unit 14 may effectively be enhanced, lateral spreading of the charge carriers improved, and operating voltage of the LED chip lowered, thereby increasing the protection again ESD for the light-emitting device 1, 2, 3.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising:
an epitaxial structure that includes a first semiconductor layer, an active layer disposed on said first semiconductor layer, and a second semiconductor layer disposed on said active layer opposite to said first semiconductor layer;
a transparent current spreading unit that is disposed on said second semiconductor layer;
a first electrode that is disposed on said epitaxial structure and electrically connected to said first semiconductor layer; and
a second electrode that is disposed on said transparent current spreading unit;
wherein said transparent current spreading unit includes a first transparent current spreading layer and a second transparent current spreading layer, said first transparent current spreading layer being disposed between and connected to said second electrode and said second transparent current spreading layer, said second transparent current spreading layer being connected to said second semiconductor layer, said first transparent current spreading layer being doped with aluminum and having a thickness that accounts for 0.5% to 33% of a thickness of said transparent current spreading unit, said second transparent current spreading layer having a thickness greater than that of said first transparent current spreading layer.

2. The light-emitting device as claimed in claim 1, wherein said transparent current spreading unit includes indium tin oxide (ITO), indium zinc oxide (IZO), indium oxide (InO), tin oxide (SnO), cadmium tin oxide (CTO), antimony tin oxide (ATO), aluminum zinc oxide (AZO), zinc tin oxide (ZTO), gallium-doped zinc oxide (GZO), tungsten-doped indium oxide (IWO), zinc oxide (ZnO) or combinations thereof.

3. The light-emitting device as claimed in claim 1, wherein the thickness of said transparent current spreading unit ranges from 20 nm to 150 nm.

4. The light-emitting device as claimed in claim 1, wherein the thickness of said first transparent current spreading layer ranges from 1 nm to 50 nm.

5. The light-emitting device as claimed in claim 1, wherein the thickness of said second transparent current spreading layer ranges from 10 nm to 140 nm.

6. The light-emitting device as claimed in claim 1, wherein the thickness of said second transparent current spreading layer is at least double of the thickness of said first transparent current spreading layer.

7. The light-emitting device as claimed in claim 1, wherein said first transparent current spreading layer has an aluminum concentration that decreases in a direction from said second electrode to said second semiconductor layer.

8. The light-emitting device as claimed in claim 1, further comprising a current blocking layer disposed between said second electrode and said second semiconductor layer.

9. The light-emitting device as claimed in claim 8, wherein said current blocking layer is embedded in said transparent current spreading unit.

10. The light-emitting device as claimed in claim 9, wherein said current blocking layer is embedded in said second transparent current spreading layer.

11. The light-emitting device as claimed in claim 1, wherein said second transparent current spreading layer covers said second semiconductor layer.

12. The light-emitting device as claimed in claim 11, wherein said second transparent current spreading layer is in direct contact with said second semiconductor layer.

13. The light-emitting device as claimed in claim 1, wherein said light-emitting device has a length no greater than 200 μm.

14. The light-emitting device as claimed in claim 1, further comprising an insulation layer that covers said epitaxial structure, said transparent current spreading unit, said first electrode and said second electrode, said insulation layer having a first opening that exposes said first electrode and a second opening that exposes said second electrode.

15. The light-emitting device as claimed in claim 14, further includes a first pad and a second pad which are located on said insulation layer and respectively extend into said first opening and said second opening so as to be respectively and electrically connected to said first electrode and said second electrode.

16. The light-emitting device as claimed in claim 14, wherein said insulation layer is made of one of an inorganic material and a dielectric material.

17. The light-emitting device as claimed in claim 16, wherein said insulation layer is a distributed Bragg reflector.

18. The light-emitting device as claimed in claim 1, further comprising a substrate which is a patterned substrate including a base and a plurality of protrusions disposed on said base.

19. The light-emitting device as claimed in claim 18, wherein each of said protrusions contains at least one light extraction layer which has a refractive index lower than that of said base.

20. A light-emitting apparatus, comprising:
a circuit control component; and
a light source that is coupled to said circuit control component and that includes the light-emitting device as claimed in claim 1.

* * * * *